US010332674B2

(12) United States Patent
Ishida

(10) Patent No.: US 10,332,674 B2
(45) Date of Patent: Jun. 25, 2019

(54) ELECTRONIC COMPONENT

(71) Applicant: MURATA MANUFACTURING CO., LTD., Kyoto-fu (JP)

(72) Inventor: Kosuke Ishida, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 249 days.

(21) Appl. No.: 15/450,502

(22) Filed: Mar. 6, 2017

(65) Prior Publication Data
US 2017/0301460 A1 Oct. 19, 2017

(30) Foreign Application Priority Data

Apr. 19, 2016 (JP) ................. 2016-083289

(51) Int. Cl.
*H01G 4/40* (2006.01)
*H01G 4/30* (2006.01)
(Continued)

(52) U.S. Cl.
CPC .......... *H01F 27/40* (2013.01); *H01F 17/0013* (2013.01); *H01F 27/24* (2013.01); *H01F 27/2804* (2013.01); *H01F 27/292* (2013.01); *H01G 4/005* (2013.01); *H01G 4/30* (2013.01); *H01G 4/40* (2013.01); *H03H 1/00* (2013.01); *H03H 7/427* (2013.01);
(Continued)

(58) Field of Classification Search
CPC . H01G 4/40; H01G 4/30; H01G 4/232; H01F 27/40
USPC ........................................... 361/270
See application file for complete search history.

(56) References Cited

U.S. PATENT DOCUMENTS 10,115,521 B2 * 10/2018 Hamada ............. H01F 17/0013
2015/0116899 A1 * 4/2015 Kayatani ................. H01G 4/30
361/301.4
(Continued)

FOREIGN PATENT DOCUMENTS

JP 2009-212255 A 9/2009
JP 2012-015494 A 1/2012
(Continued)

OTHER PUBLICATIONS

An Office Action; "Notification of Reasons for Refusal," Mailed by the Japanese Patent Office dated Oct. 9, 2018, which corresponds to Japanese Patent Application No. 2016-083289 and is related to U.S. Appl. No. 15/450,502; with English language translation.

*Primary Examiner* — Dharti H Patel

(74) *Attorney, Agent, or Firm* — Studebaker & Brackett PC

(57) ABSTRACT

An electronic component includes a first inductor which is provided on a first direction side relative to a first main surface, which includes one or more first inductor conductive layers having substantially a spiral shape when viewed from the first direction side, and which includes a first end portion and a second end portion; a first outer electrode and a second outer electrode provided on a surface different from the first main surface of a substrate; and a first surface mounted electronic component which is provided on the first direction side relative to the first inductor, which overlaps the first inductor when viewed from the first direction side, and which includes a third outer electrode and a fourth outer electrode.

9 Claims, 6 Drawing Sheets

(51) Int. Cl.
*H01G 4/005* (2006.01)
*H01G 4/228* (2006.01)
*H01F 27/40* (2006.01)
*H01F 27/29* (2006.01)
*H01F 27/28* (2006.01)
*H01F 27/24* (2006.01)
*H01F 17/00* (2006.01)
*H03H 7/42* (2006.01)
*H03H 1/00* (2006.01)

(52) U.S. Cl.
CPC ............... *H01F 2017/0093* (2013.01); *H01F 2027/2809* (2013.01); *H01G 4/228* (2013.01); *H03H 2001/0021* (2013.01)

(56) References Cited

U.S. PATENT DOCUMENTS

| | | | | |
|---|---|---|---|---|
| 2015/0116901 A1* | 4/2015 | Sasaoka | ................... | H01G 4/30 361/301.4 |
| 2015/0221441 A1* | 8/2015 | Katsuyama | .............. | H01G 4/30 361/301.4 |
| 2016/0073499 A1* | 3/2016 | Ogawa | ................ | H01L 23/3121 361/736 |
| 2016/0165720 A1* | 6/2016 | Nishino | ............... | H05K 3/4632 361/790 |

FOREIGN PATENT DOCUMENTS

| WO | 2007145189 A1 | 12/2007 |
|---|---|---|
| WO | 2012137386 A1 | 10/2012 |

* cited by examiner

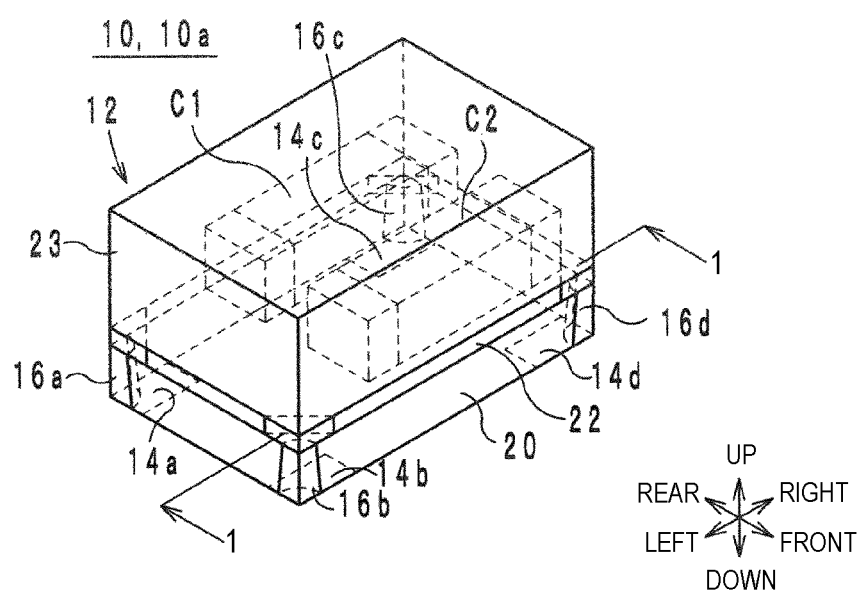

ELECTRONIC COMPONENT

CROSS REFERENCE TO RELATED APPLICATIONS

This application claims benefit of priority to Japanese Patent Application 2016-083289 filed Apr. 19, 2016, the entire content of which is incorporated herein by reference.

TECHNICAL FIELD

The present disclosure relates to electronic components, and more particularly, to an electronic component including an inductor.

BACKGROUND

As a disclosure relating to known electronic components, for example, a coil component described in Japanese Unexamined Patent Application Publication No. 2009-212255 has been known. The coil component includes an insulating resin material layer, two magnetic substrates, and two spiral conductors. The insulating resin material layer has a structure in which multiple layer-like insulating resin bodies each having substantially a rectangular shape are laminated from the top side to the bottom side when viewed from the top side. The two spiral conductive layers are provided on upper surfaces of different insulating resin bodies and each have substantially a spiral shape. The two spiral conductive layers are magnetically coupled by overlapping each other when viewed from the top side. Accordingly, the two spiral conductive layers form a common mode choke coil. Furthermore, the two magnetic substrates sandwich the insulating resin material layer from the top side and the bottom side.

SUMMARY

The above-mentioned coil component is combined with, for example, a surface mounted electronic component such as a capacitor, and is used as a noise filter. In this case, the coil component is mounted on a circuit board, and the surface mounted electronic component such as a capacitor is also mounted on the circuit board. However, the circuit board needs to have an area in which the coil component is to be mounted and an area in which the surface mounted electronic component is to be mounted. Therefore, in the case where the coil component and the surface mounted electronic component are combined, a large mounting area is required.

Accordingly, it is an object of the present disclosure to provide an electronic component with a reduced mounting area.

According to one embodiment of the present disclosure, an electronic component includes a substrate including a first main surface and a second main surface; a first inductor which is provided on a first direction side relative to the first main surface when a direction separating from the substrate in a normal direction of the first main surface is defined as the first direction, which includes one or more first inductor conductive layers having substantially a spiral shape when viewed from the first direction side relative to the first main surface, and which includes a first end portion and a second end portion; a first outer electrode and a second outer electrode which are provided on a surface different from the first main surface of the substrate; and a first surface mounted electronic component which is provided on the first direction side relative to the first inductor, which overlaps the first inductor when viewed from the first direction side relative to the first main surface, and which includes a third outer electrode and a fourth outer electrode. The first end portion and the first outer electrode are electrically connected. The second end portion and the third outer electrode are electrically connected. The second outer electrode and the fourth outer electrode are electrically connected.

According to the present disclosure, the mounting area may be reduced.

Other features, elements, characteristics and advantages of the present disclosure will become more apparent from the following detailed description with reference to the attached drawings.

BRIEF DESCRIPTION OF THE DRAWINGS

FIG. 1B is an external perspective view of the electronic component.

DETAILED DESCRIPTION (Configuration of Electronic Component)

Figure 1A:
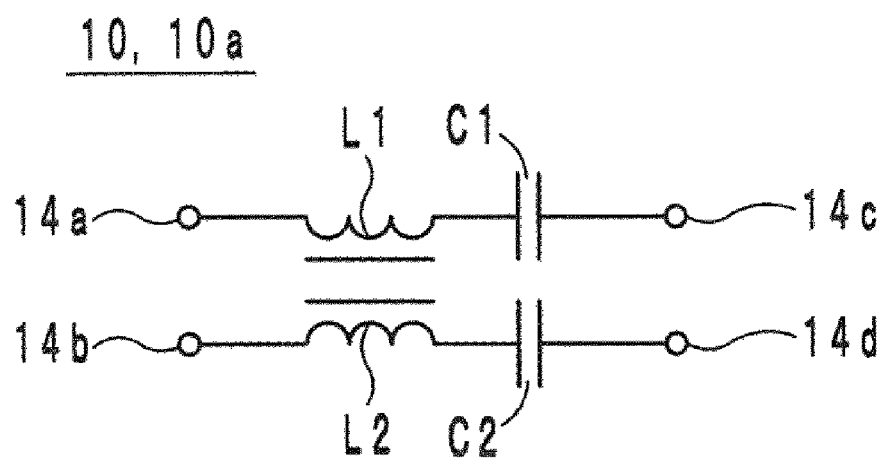
FIG. 1A is an equivalent circuit diagram of an electronic component.
Figure 2:
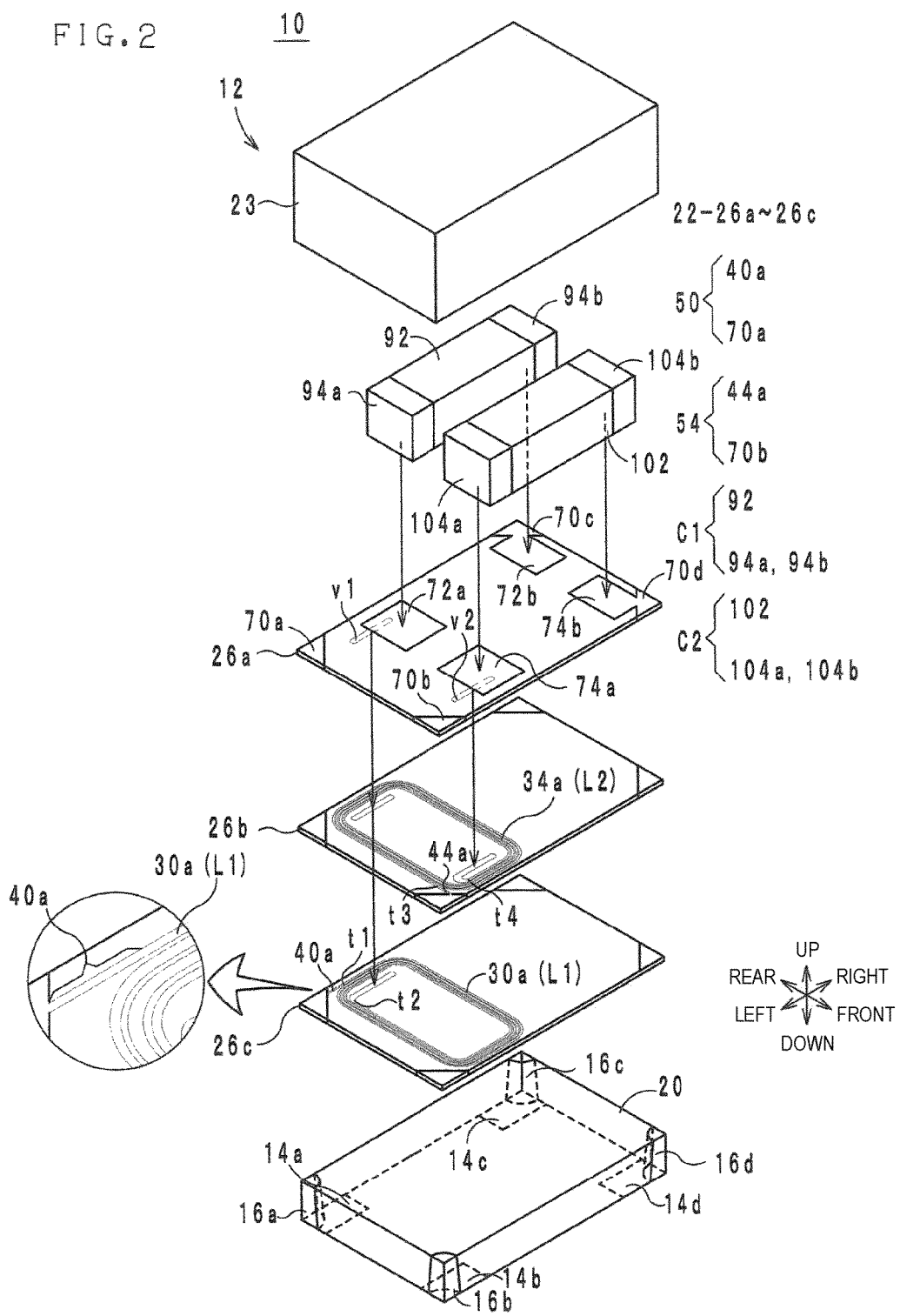
FIG. 2 is an exploded perspective view of the electronic component of FIG. 1B.
Figure 3:
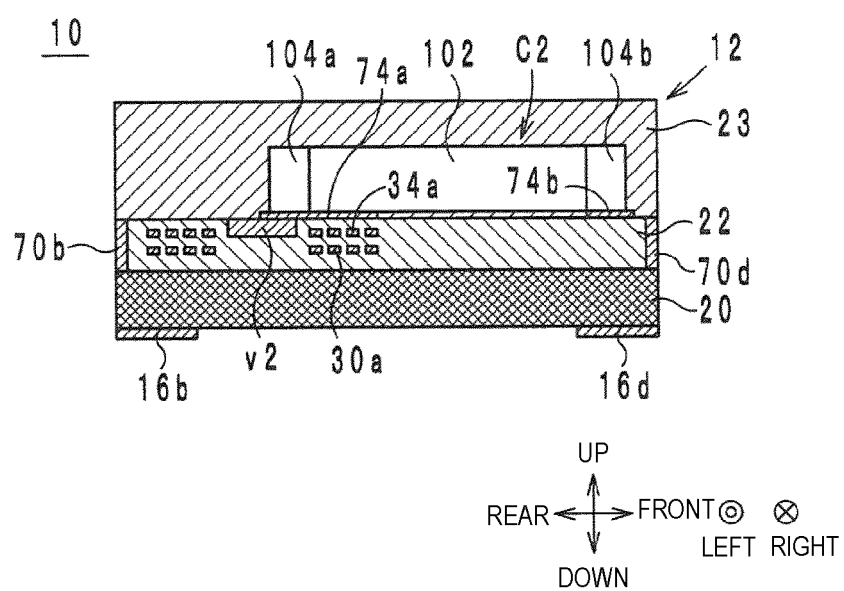
FIG. 3 is a cross-section structure diagram taken along line 1-1 of FIG. 1B.

First, a configuration of an electronic component 10 according to an embodiment will be described with reference to drawings. FIG. 1A is an equivalent circuit diagram of electronic components 10 and 10a. FIG. 1B is an external perspective view of the electronic components 10 and 10a. FIG. 2 is an exploded perspective view of the electronic component 10 of FIG. 1B. FIG. 3 is a cross-section structure diagram taken along line 1-1 of the electronic component 10 of FIG. 1B. Hereinafter, the lamination direction of the electronic component 10 is defined as an up-down direction, the direction in which a long side extends when viewed from the top side is defined as a left-right direction, and the direction in which a short side extends when viewed from the top side is defined as a front-rear direction. Furthermore, the up-down direction, the front-end direction, and the left-right direction are orthogonal to one another. The lamination direction is a direction in which insulating layers, which will be described later, are laminated. Furthermore, the up-down direction, the left-right direction, and the front-rear direction referred to when the electronic component 10 is used are not necessarily equal to the up-down direction, the left-right direction, and the front-rear direction defined in FIG. 1B and the like.

The electronic component 10 includes, as illustrated in FIG. 1A, inductors L1 and L2, capacitors C1 and C2, and outer electrodes 14a to 14d. The inductor L1 and the capacitor C1 are electrically connected in series to be arranged in this order between the outer electrode 14a and the outer electrode 14c. The inductor L2 and the capacitor C2 are electrically connected in series to be arranged in this order between the outer electrode 14b and the outer electrode 14d. Furthermore, the inductor L1 and the inductor L2 are magnetically coupled to form a common mode choke coil. The electronic component 10 with the above configuration is used as a common mode noise filter for removing common mode noise from a differential transmission signal.

The electronic component 10 includes, as illustrated in FIG. 1B, FIG. 2, and FIG. 3, a main body 12, the outer electrodes 14a to 14d, connection parts 16a to 16d, lead parts 50 and 54, connection conductors 70c and 70d, electrode pads 72a, 72b, 74a, and 74b, interlayer connection conductors v1 and v2, the inductors L1 and L2, and the capacitors C1 and C2.

The main body 12 has, as illustrated in FIG. 1B, FIG. 2, and FIG. 3, substantially a rectangular parallelepiped shape, and includes a magnetic substrate 20, a multilayer body 22, and a mold part 23. The mold part 23, the multilayer body 22, and the magnetic substrate 20 are laminated in this order from the top side to the bottom side.

The magnetic substrate 20 is a plate-like member having two main surfaces (an upper surface is an example of a first main surface, and a lower surface is an example of a second main surface) each having substantially a rectangular shape when viewed from the top side. Four corners of the magnetic substrate 20 are cut out when viewed from the top side. More particularly, a fan-like cutout having a central angle of 90 degrees is provided at each of the four corners of the magnetic substrate 20 when viewed from the top side. The four cutouts extend in the up-down direction on side faces of the magnetic substrate 20 from the upper surface up to the lower surface of the magnetic substrate 20.

The magnetic substrate 20 is made of a magnetic material. The magnetic substrate 20 is produced by cutting sintered ferrite ceramics. The magnetic substrate 20 may be produced by, for example, applying paste formed by ferrite calcined powder and a binder to a ceramics substrate made of alumina or the like or may be produced by laminating and firing a green sheet made of a ferrite material.

The outer electrodes 14a to 14d are provided on the lower surface of the magnetic substrate 20 and each have substantially a rectangular shape. More particularly, the outer electrode 14a is provided at the corner on a left rear side of the lower surface of the magnetic substrate 20. The outer electrode 14b is provided at the corner on a left front side of the lower surface of the magnetic substrate 20. The outer electrode 14c is provided at the corner on a right rear side of the lower surface of the magnetic substrate 20. Accordingly, the outer electrode 14c is located outward relative to the outermost periphery of inductor conductive layers 30a and 34a, which will be described later, when viewed from the top side. The outer electrode 14d is provided at the corner on a right front side of the lower surface of the magnetic substrate 20. Accordingly, the outer electrode 14d is located outward relative to the outermost periphery of the inductor conductive layers 30a and 34a, which will be described later, when viewed from the top side. The outer electrodes 14a to 14d are produced by, for example, laminating an Au film, an Ni film, a Cu film, and a Ti film by a sputtering method. The outer electrodes 14a to 14d may be produced by, for example, printing and baking paste containing metal such as Ag or Cu or may be produced by forming a film of Ag, Cu, or the like by deposition or plating.

The connection parts 16a to 16d are provided at the four cutouts provided at the magnetic substrate 20. The connection part 16a (an example of a first connection part) is provided at the cutout on a left rear side of the magnetic substrate 20 and extends across the magnetic substrate 20 in the up-down direction. A lower end of the connection part 16a is connected to the outer electrode 14a. The connection part 16b is provided at the cutout on a left front side of the magnetic substrate 20 and extends across the magnetic substrate 20 in the up-down direction. A lower end of the connection part 16b is connected to the outer electrode 14b. The connection part 16c (an example of a second connection part) is provided at the cutout on a right rear side of the magnetic substrate 20 and extends across the magnetic substrate 20 in the up-down direction. A lower end of the connection part 16c is connected to the outer electrode 14c. The connection part 16d is provided at the cutout on a right front side of the magnetic substrate 20 and extends across the magnetic substrate 20 in the up-down direction. A lower end of the connection part 16d is connected to the outer electrode 14d. The connection parts 16a to 16d are located outward relative to the outermost periphery of the inductor conductive layers 30a and 34a, which will be described later, when viewed from the top side. The connection parts 16a to 16d are produced by, for example, forming a conductive film containing Cu as a main component by plating. The connection parts 16a to 16d may be produced by, for example, a material with a high electrical conductivity such as Ag or Au.

The multilayer body 22 is provided on the upper surface of the magnetic substrate 20, and has a main surface having substantially a rectangular shape when viewed from the top side. The multilayer body 22 includes insulating layers 26a to 26c (an example of a plurality of insulating layers). The multilayer body 22 is formed directly on the upper surface of the magnetic substrate 20. Accordingly, the magnetic substrate 20 is in contact with the lower surface of the multilayer body 22.

The insulating layers 26a to 26c are laminated in this order from the top side to the bottom side and has substantially the same shape as the upper surface of the magnetic substrate 20. However, four corners of each of the insulating layers 26a to 26c are cut out when viewed from the top side.

The insulating layers 26a to 26c contain insulating resin as a material, and is made of polyimide in this embodiment. Therefore, the insulating layers 26a to 26c are made of a nonmagnetic material. However, the insulating layer 26a, which is the uppermost layer, may be made of a magnetic material. Furthermore, the insulating layers 26a to 26c may be produced from, for example, insulating resin such as benzocyclobutene.

The inductor L1 (an example of a first inductor) is provided in a portion above the upper surface of the magnetic substrate 20 (a first direction separating from the substrate in a normal direction of the first main surface), and is provided within the multilayer body 22 in this embodiment. The inductor L1 includes an inductor conductive layer 30a (an example of one or more first inductor conductive layers) and end portions t1 and t2 (the end portion t1 is an example of a first end portion, and the end portion t2 is an example of a second end portion).

The inductor conductive layer 30a (an example of a second inductor conductive layer) is provided on the upper surface of the insulating layer 26c, and has substantially a spiral shape extending from an outer peripheral side toward an inner peripheral side while circulating clockwise (an example of a predetermined circulation direction) when viewed from the top side (an example when viewed from a first direction side relative to the first main surface). The inductor conductive layer 30a has a length of about four turns. Furthermore, the inductor conductive layer 30a is provided in a left half region of the insulating layer 26c when viewed from the top side, and has substantially a rectangular outer shape. The end portion t1 of the inductor L1 is an end portion on the outer peripheral side of the inductor conductive layer 30a. The end portion t2 of the inductor L1 is an end portion on the inner peripheral side of the inductor conductive layer 30a.

A lead part 50 allows electric connection between the end portion on the outer peripheral side of the inductor conductive layer 30a (that is, the end portion t1) and the outer electrode 14a (an example of a first outer electrode), and does not have substantially a spiral shape when viewed from the top side, as illustrated in FIG. 2. The lead part 50 includes a lead conductive layer 40a and a connection conductor 70a. The connection conductor 70a is a conductor of substantially a triangular prism shape provided at the corner on a left rear side of the insulating layers 26a to 26c. Accordingly, the connection conductor 70a is located outward relative to the outermost periphery of the inductor conductive layers 30a and 34a when viewed from the top side. For easier understanding, in FIG. 2, the connection conductor 70a is described as being divided into three. Similar to the connection conductor 70a, connection conductors 70b to 70d, which will be described later, are also described as being divided into three. The connection conductor 70a extends in the up-down direction from the upper surface of the insulating layer 26a to the lower surface of the insulating layer 26c. The lower end of the connection conductor 70a is connected to the connection part 16a.

The lead conductive layer 40a is provided on the upper surface of the insulating layer 26c, and allows connection between an end portion on the outer peripheral side of the inductor conductive layer 30a and the connection conductor 70a. The lead conductive layer 40a does not have substantially a spiral shape when viewed from the top side, and extends leftwards from the end portion on the outer peripheral side of the inductor conductive layer 30a. As illustrated in the enlarged view of FIG. 2, the border between the inductor conductive layer 30a and the lead conductive layer 40a is at a position where the lead conductive layer 40a is separated from the locus of substantially the spiral shape of the inductor conductive layer 30a. Accordingly, the end portion on the outer peripheral side of the inductor conductive layer 30a (that is, the end portion t1) and the outer electrode 14a are electrically connected with the lead part 50 (the lead conductive layer 40a and the connection conductor 70a) and the connection part 16a interposed therebetween.

The electrode pad 72a (an example of a first electrode pad) is provided on the upper surface of the insulating layer 26a, which is provided on the uppermost side, and has substantially a rectangular shape when viewed from the top side. In this embodiment, the electrode pad 72a is provided near the end portion t2 of the inductor L1 in a rear half region on the upper surface of the insulating layer 26a. Furthermore, part of the electrode pad 72a overlaps a region surrounded by the inductor conductive layers 30a and 34a when viewed from the top side.

The interlayer connection conductor v1 is a conductor which penetrates through the insulating layers 26a and 26b in the up-down direction and which is provided on the upper surface of the insulating layer 26c, and has substantially a linear shape extending in the left-right direction when viewed from the top side. The interlayer connection conductor v1 is provided near a rear end of the region surrounded by the inductor conductive layer 30a when viewed from the top side. The interlayer connection conductor v1 allows connection between the end portion on the inner peripheral side of the inductor conductive layer 30a and the electrode pad 72a. Accordingly, the electrode pad 72a is electrically connected to the end portion t2 of the inductor L1 with the interlayer connection conductor v1 interposed therebetween.

The electrode pad 72b (an example of a second electrode pad) is provided on the upper surface of the insulating layer 26a, which is provided on the uppermost side, and has substantially a rectangular shape when viewed from the top side. In this embodiment, the electrode pad 72b is provided near the corner on the right rear side of the upper surface of the insulating layer 26a when viewed from the top side. Accordingly, the electrode pad 72b is located outward relative to the outermost periphery of the inductor conductive layers 30a and 34a when viewed from the top side. Furthermore, the electrode pad 72a and the electrode pad 72b are arranged with a space interposed therebetween in the left-right direction.

The connection conductor 70c is a conductor of a triangular prism shape provided at the corner on the right rear side of the insulating layers 26a to 26c. Accordingly, the connection conductor 70c is located outward relative to the outermost periphery of the inductor conductive layers 30a and 34a when viewed from the top side. The connection conductor 70c extends in the up-down direction from the upper surface of the insulating layer 26a to the lower surface of the insulating layer 26c. The upper end of the connection conductor 70c is connected to the electrode pad 72b. The lower end of the connection conductor 70c is connected to the connection part 16c. Accordingly, the electrode pad 72b is electrically connected to the outer electrode 14c (an example of a second outer electrode) with the connection conductor 70c and the connection part 16c interposed therebetween.

The capacitor C1 (an example of a first surface mounted electronic component) is a multilayer chip component, and includes a main body 92 and outer electrodes 94a and 94b (the outer electrode 94a is an example of a third outer electrode, and the outer electrode 94b is an example of a fourth outer electrode). The main body 92 has a structure in which a plurality of insulating layers and capacitor conductive layers are laminated, and has substantially a rectangular parallelepiped shape. The insulating layers are made of, for example, dielectric ceramics. The capacitor conductive layers are made from, for example, conductors containing Ag as a main component. The internal structure of the capacitor C1 is a general structure, and therefore, explanation for the internal structure of the capacitor C1 will be omitted.

The outer electrode 94a covers the entire left surface of the main body 92, and is folded onto the upper surface, lower surface, front surface, and rear surface of the main body 92. The outer electrode 94b covers the entire right surface of the main body 92, and is folded onto the upper surface, lower surface, front surface, and rear surface of the main body 92. For example, the outer electrodes 94a and 94b may be produced by printing and baking paste containing metal such as Ag or Cu or may be produced by forming a film of Ag, Cu, or the like by deposition or plating.

The capacitor C1 is mounted on the upper surface of the multilayer body 22. Accordingly, the capacitor C1 is provided in a portion above the inductor L1. Furthermore, the outer electrode 94a is mounted on the electrode pad 72a by soldering. Accordingly, the outer electrode 94a and the end portion t2 of the inductor L1 are electrically connected with the electrode pad 72a and the interlayer connection conductor v1 interposed therebetween.

Furthermore, the outer electrode 94b is mounted on the electrode pad 72b by soldering. Accordingly, the outer electrode 14c and the outer electrode 94b are electrically connected with the connection conductor 70c, the electrode pad 72b, and the connection part 16c interposed therebetween. Furthermore, as described above, the electrode pad 72b is located outward relative to the outermost periphery of the inductor conductive layers 30a and 34a when viewed from the top side. Accordingly, the outer electrode 94b is located outward relative to the outermost periphery of the inductor conductive layers 30a and 34a when viewed from the top side. Furthermore, the outer electrode 14c is located outward relative to the outermost periphery of the inductor conductive layers 30a and 34a when viewed from the top side. Accordingly, the outer electrode 14c and the outer electrode 94b are electrically connected in a portion which is outward relative to the outermost periphery of the inductor conductive layers 30a and 34a when viewed from the top side.

Furthermore, the outer electrode 94a is located within a region surrounded by the inductor conductive layers 30a and 34a when viewed from the top side, and the outer electrode 94b is located outward relative to the outermost periphery of the inductor conductive layers 30a and 34a when viewed from the top side. Accordingly, the capacitor C1 stretches over a region on the inner peripheral side relative to the inductor conductive layers 30a and 34a and a region on the outer peripheral side relative to the inductor conductive layers 30a and 34a when viewed from the top side. Therefore, the capacitor C1 overlaps the inductor conductive layers 30a and 34a (inductors L1 and L2) when viewed from the top side.

The inductor L2 (an example of a second inductor) is provided in a portion above the upper surface of the magnetic substrate 20. In this embodiment, the inductor L2 is provided within the multilayer body 22. The inductor L2 includes the inductor conductive layer 34a (an example of one or more fifth inductor conductive layers), and includes end portions t3 and t4 (the end portion t3 is an example of a third end portion, and the end portion t4 is an example of a fourth end portion).

The inductor conductive layer 34a is provided on the upper surface of the insulating layer 26b, and has substantially a spiral shape extending from the outer peripheral side toward the inner peripheral side while circulating clockwise (an example of a predetermined circulation direction) when viewed from the top side. The inductor conductive layer 34a has a length of about 4 turns. Furthermore, the inductor conductive layer 34a is provided in a left half region of the insulating layer 26b when viewed from the top side, and has substantially a rectangular outer shape. Accordingly, the inductor conductive layer 34a overlaps the inductor conductive layer 30a when viewed from the top side. Therefore, the inductor conductive layer 30a and the inductor conductive layer 34a are magnetically coupled, and the inductor L1 and the inductor L2 form a common mode choke coil. The end portion t3 of the inductor L2 is an end portion on the outer peripheral side of the inductor conductive layer 34a. The end portion t4 of the inductor L2 is an end portion on the inner peripheral side of the inductor conductive layer 34a.

The lead part 54 allows electric connection between an end portion on the outer peripheral side of the inductor conductive layer 34a (that is, the end portion t3) and the outer electrode 14b (an example of a fifth outer electrode), and does not have substantially a spiral shape when viewed from the top side, as illustrated in FIG. 2. The lead part 54 includes a lead conductive layer 44a and the connection conductor 70b. The connection conductor 70b is a conductor of substantially a triangular prism shape which is provided at the corner on the left front side of the insulating layers 26a to 26c. The connection conductor 70b is located outward relative to the outermost periphery of the inductor conductive layers 30a and 34a when viewed from the top side. The connection conductor 70b extends in the up-down direction from the upper surface of the insulating layer 26a to the lower surface of the insulating layer 26c, and the lower end of the connection conductor 70b is connected to the connection part 16b.

The lead conductive layer 44a is provided on the upper surface of the insulating layer 26b, and allows connection between the end portion on the outer peripheral side of the inductor conductive layer 34a and the connection conductor 70b. The lead conductive layer 44a does not have substantially a spiral shape when viewed from the top side, and extends forward from the end portion on the outer peripheral side of the inductor conductive layer 34a. The border between the inductor conductive layer 34a and the lead conductive layer 44a is at the position where the lead conductive layer 44a is separated from the locus of substantially the spiral shape of the inductor conductive layer 34a. Accordingly, the end portion on the outer peripheral side of the inductor conductive layer 34a (that is, the end portion t3) and the outer electrode 14b are electrically connected with the lead part 54 (the lead conductive layer 44a and the connection conductor 70b) and the connection part 16b therebetween.

The electrode pad 74a is provided on the upper surface of the insulating layer 26a, which is provided on the uppermost side, and has substantially a rectangular shape when viewed from the top side. In this embodiment, the electrode pad 74a is provided near the end portion t4 of the inductor L2 in a front half region of the upper surface of the insulating layer 26a when viewed from the top side. Furthermore, part of the electrode pad 74a overlaps the region surrounded by the inductor conductive layers 30a and 34a when viewed from the top side.

The interlayer connection conductor v2 is a conductor which penetrates through the insulating layers 26a and 26b in the up-down direction and which is provided on the upper surface of the insulating layer 26c, and has substantially a linear shape extending in the left-right direction when viewed from the top side. The interlayer connection conductor v2 is provided near a front end of the region surrounded by the inductor conductive layer 34a when viewed from the top side. The interlayer connection conductor v2 allows connection between the end portion on the inner peripheral side of the inductor conductive layer 34a and the electrode pad 74a. Accordingly, the electrode pad 74a is electrically connected to the end portion t4 of the inductor L2 with the interlayer connection conductor v2 interposed therebetween.

The electrode pad 74b is provided on the upper surface of the insulating layer 26a, which is provided on the uppermost side, and has substantially a rectangular shape when viewed from the top side. In this embodiment, the electrode pad 74b is provided near the corner on the right front side of the upper surface of the insulating layer 26a when viewed from the top side. Accordingly, the electrode pad 74b is located outward relative to the outermost periphery of the inductor conductive layers 30a and 34a when viewed from the top side. Furthermore, the electrode pad 74a and the electrode pad 74b are arranged with a space interposed therebetween in the left-right direction.

The connection conductor 70d is a conductor of a triangular prism shape provided at the corner on the right front side of the insulating layers 26a to 26c. Accordingly, the connection conductor 70d is located outward relative to the outermost periphery of the inductor conductive layers 30a and 34a when viewed from the top side. The connection conductor 70d extends in the up-down direction from the upper surface of the insulating layer 26a to the lower surface of the insulating layer 26c. The upper end of the connection conductor 70d is connected to the electrode pad 74b. The lower end of the connection conductor 70d is connected to the connection part 16d. Accordingly, the electrode pad 74b is electrically connected to the outer electrode 14d (an example of a sixth outer electrode) with the connection conductor 70d and the connection part 16d interposed therebetween.

The capacitor C2 (an example of a second surface mounted electronic component) is a multilayer chip component, and includes a main body 102 and outer electrodes 104a and 104b (the outer electrode 104a is an example of a seventh outer electrode, and the outer electrode 104b is an example of an eighth outer electrode). The main body 102 has a structure in which a plurality of insulating layers and capacitor conductive layers are laminated, and has substantially a rectangular parallelepiped shape. The insulating layers are made of, for example, dielectric ceramics. The capacitor conductive layers are made from, for example, conductors containing Ag as a main component. The internal structure of the capacitor C2 is a general structure, and therefore, explanation for the internal structure of the capacitor C2 will be omitted.

The outer electrode 104a covers the entire left surface of the main body 102, and is folded onto the upper surface, lower surface, front surface, and rear surface of the main body 102. The outer electrode 104b covers the entire right surface of the main body 102, and is folded onto the upper surface, lower surface, front surface, and rear surface of the main body 102. For example, the outer electrodes 104a and 104b may be produced by printing and baking paste containing metal such as Ag or Cu or may be produced by forming a film of Ag, Cu, or the like by deposition or plating.

The capacitor C2 is mounted on the upper surface of the multilayer body 22. Accordingly, the capacitor C2 is provided in a portion above the inductor L2. Furthermore, the outer electrode 104a is mounted on the electrode pad 74a by soldering. Accordingly, the outer electrode 104a and the end portion t4 of the inductor L2 are electrically connected with the electrode pad 74a and the interlayer connection conductor v2 interposed therebetween.

Furthermore, the outer electrode 104b is mounted on the electrode pad 74b by soldering. Accordingly, the outer electrode 14d and the outer electrode 104b are electrically connected with the connection conductor 70d, the electrode pad 74b, and the connection part 16d interposed therebetween. Furthermore, as described above, the electrode pad 74b is located outward relative to the outermost periphery of the inductor conductive layers 30a and 34a when viewed from the top side. Accordingly, the outer electrode 104b is located outward relative to the outermost periphery of the inductor conductive layers 30a and 34a when viewed from the top side. Furthermore, the outer electrode 14d is located outward relative to the outermost periphery of the inductor conductive layers 30a and 34a when viewed from the top side. Accordingly, the outer electrode 14d and the outer electrode 104b are electrically connected in the portion which is outward relative to the outermost periphery of the inductor conductive layers 30a and 34a when viewed from the top side.

Furthermore, the outer electrode 104a is located within a region surrounded by the inductor conductive layers 30a and 34a when viewed from the top side, and the outer electrode 104b is located outward relative to the outermost periphery of the inductor conductive layers 30a and 34a when viewed from the top side. Accordingly, the capacitor C2 stretches over a region on the inner peripheral side relative to the inductor conductive layers 30a and 34a and a region on the outer peripheral side relative to the inductor conductive layers 30a and 34a when viewed from the top side. Therefore, the capacitor C2 overlaps the inductor conductive layers 30a and 34a (inductors L1 and L2) when viewed from the top side.

The mold part 23 is provided on the upper surface of the multilayer body 22, and has substantially a rectangular parallelepiped shape. The mold part 23 is a resin member which covers the capacitors C1 and C2. The mold part 23 is made of, for example, an epoxy resin. The mold part 23 covers the upper surface of the multilayer body 22, so that the electronic component 10 has substantially a rectangular parallelepiped shape. The mold part 23 is a member separated from the multilayer body 22, and is not part of the multilayer body 22.

An operation of the electronic component 10 configured as described above will be described below. The outer electrodes 14a and 14b are used as input terminals. The outer electrodes 14c and 14d are used as output terminals. However, the outer electrodes 14a and 14b may be used as output terminals, and the outer electrodes 14c and 14d may be used as input terminals. Furthermore, the inductor L1 and the inductor L2 are magnetically coupled to form a common mode filter.

A differential transmission signal is input from the outer electrodes 14a and 14b and output from the outer electrodes 14c and 14d. In the case where a differential transmission signal contains common mode noise, the inductors L1 and L2 generate magnetic flux in the same direction, due to current of the common mode noise. Therefore, the magnetic flux is strengthened and impedance to the current of the common mode noise occurs. As a result, the current of the common mode noise is converted into heat, and therefore, the current is prevented from passing through the inductors L1 and L2.

(Manufacturing Method for Electronic Component)

A manufacturing method for the electronic component 10 will be described below. A case where one electronic component is manufactured will be described below as an example. However, in actuality, multiple electronic components 10 are formed at the same time by laminating a large-sized mother magnetic substrate and mother insulating layer to produce a mother body and cutting the mother body.

First, a polyimide resin, which is a photosensitive resin, is applied to the entire upper surface of the magnetic substrate 20. Next, positions corresponding to four corners of the insulating layer 26c are light-shielded, and light exposure is performed. Accordingly, a portion of the polyimide resin that is not light-shielded is solidified. After that, a photoresist is removed by an organic solvent, and development is performed, so that unsolidified polyimide resin is removed and thermosetting is performed. Thus, the insulating layer 26c is formed.

Next, an Ag film is formed on the insulating layer 26c and the magnetic substrate 20 which is exposed from the insulating layer 26c by sputtering. Next, a photoresist is formed on a portion in which the inductor conductive layer 30a, the lead conductive layer 40a, the connection conductors 70a to 70d, and the interlayer connection conductor v1 are formed. Then, by etching, portions of the Ag film other than the portion in which the inductor conductive layer 30a, the lead conductive layer 40a, the connection conductors 70a to 70d, and the interlayer connection conductor v1 are formed (that is, a portion covered with the photoresist) are removed. After that, by removing the photoresist using the organic solvent, part of the inductor conductive layer 30a, the lead conductive layer 40a, part of the connection conductors 70a to 70d (for one layer), and part of the interlayer connection conductor v1 are formed.

By repeating the above steps and similar steps, the insulating layers 26a and 26b, the inductor conductive layer 34a, the lead conductive layer 44a, the rest part of the connection conductors 70a to 70d, the electrode pads 72a, 72b, 74a, and 74b, the rest part of the interlayer connection conductor v1, and the interlayer connection conductor v2 are formed.

Next, by combination of electrolytic plating and photolithography, a conductive layer is formed on the inner peripheral surface of cutouts of the magnetic substrate 20, and the connection parts 16a to 16d and the outer electrodes 14a to 14d are thus formed.

Next, the capacitors C1 and C2 are formed on the electrode pads 72a, 72b, 74a, and 74b. The capacitors C1 and C2 may be mounted by, for example, soldering or using a conductive adhesive.

Finally, the upper surface of the multilayer body 22 is sealed with a resin, and the mold part 23 is thus formed. With the above steps, manufacturing of the electronic component 10 is completed.

(Effects)

With the electronic component 10 having the above configuration, the mounting area may be reduced. More particularly, in the case where the coil component and the surface mounted electronic component described in Japanese Unexamined Patent Application Publication No. 2009-212255 are mounted on a circuit board, the coil component and the surface mounted electronic component occupy different parts of the circuit board. Therefore, a large mounting area is required for the coil component and the surface mounted electronic component.

Thus, the capacitors C1 and C2 are provided within the electronic component 10. The capacitors C1 and C2 are provided in a portion above the inductors L1 and L2, and overlap the inductors L1 and L2 when viewed from the top side. Accordingly, the size of the electronic component 10 in the front-rear direction and left-right direction is smaller than the mounting area of the coil component and the surface mounted electronic component described in Japanese Unexamined Patent Application Publication No. 2009-212255. Consequently, the mounting area of the electronic component 10 is reduced.

Furthermore, the electronic component 10 does not require a lead conductive layer for allowing connection between the upper end of the interlayer connection conductor v1 and the upper end of the connection conductor 70c. More particularly, the end portion t2 of the inductor L1 (that is, an end portion on the inner peripheral side of the inductor conductive layer 30a) and the outer electrode 94a of the capacitor C1 are electrically connected. Furthermore, the outer electrode 14c and the outer electrode 94b are electrically connected. Accordingly, the end portion t2 of the inductor L1 and the outer electrode 14c are connected with the capacitor C1 interposed therebetween. That is, the upper end of the interlayer connection conductor v1 and the upper end of the connection conductor 70c are electrically connected with the capacitor C1 interposed therebetween. Consequently, a lead conductive layer for allowing connection between the upper end of the interlayer connection conductor v1 and the upper end of the connection conductor 70c is not required.

Due to the fact that the lead conductive layer is not required, occurrence of disconnection in the electronic component 10 is suppressed, as explained below. More particularly, in the case where a lead conductive layer allows connection between the upper end of the interlayer connection conductor v1 and the upper end of the connection conductor 70c, the lead conductive layer and the inductor conductive layer 30a cross each other when viewed from the top side. The inductor conductive layer 30a has substantially a spiral shape. Therefore, when the lead conductive layer extends across the inductor conductive layer 30a, the lead conductive layer and the inductor conductive layer 30a overlap a plurality of times. Thus, a portion where the lead conductive layer overlaps the inductor conductive layer 30a is at a relatively upper position, and a portion where the lead conductive layer does not overlap the inductor conductive layer 30a is at a relatively lower position. Therefore, the lead conductive layer has substantially a vertically fluctuating shape. When the lead conductive layer fluctuates as described above, the thickness of the lead conductive layer is uneven, and disconnection may occur in a portion where the thickness of the lead conductive layer is thin.

Furthermore, the coefficient of liner expansion of the lead conductive layer is different from the coefficient of linear expansion of the insulating layers 26a to 26c. Therefore, when the electronic component 10 is heated at the time of manufacturing the electronic component 10, a difference occurs between the expansion quantity of the lead conductive layer and the expansion quantity of the insulating layers 26a to 26c. Consequently, after manufacturing of the electronic component 10 is completed, internal stress is generated in the lead conductive layer, and therefore, disconnection may occur in the lead conducive layer.

In contrast, instead of the lead conductive layer, the capacitor C1 is used in the electronic component 10. The capacitor C1 is not formed on the multilayer body 22 but is manufactured independently. Therefore, unlike the lead conductive layer, the capacitor C1 does not fluctuate, and disconnection does not occur easily. Furthermore, the capacitor C1 is not thin, unlike the lead conductive layer. Therefore, disconnection caused by heat does not easily occur. For the same reason, in the electronic component 10, a lead conductive layer for allowing connection between the upper end of the interlayer connection conductor v2 and the upper end of the connection conductor 70d is not required. Therefore, the above disconnection is less likely to occur.

Furthermore, in the electronic component 10, the insulating layer 26a is made of a magnetic material. Therefore, the Q value of the inductors L1 and L2 may be improved. More particularly, in the case where the insulating layer 26a is made of a magnetic material, a magnetic flux directed upwards from the inductors L1 and L2 bends in the front-rear direction or left-right direction along the insulating layer 26a. Accordingly, the magnetic flux passing through the capacitors C1 and C2 is suppressed, and generation of eddy current is suppressed. Consequently, in the electronic component 10, the Q value of the inductors L1 and L2 is improved.

(First Variation)

Figure 4:
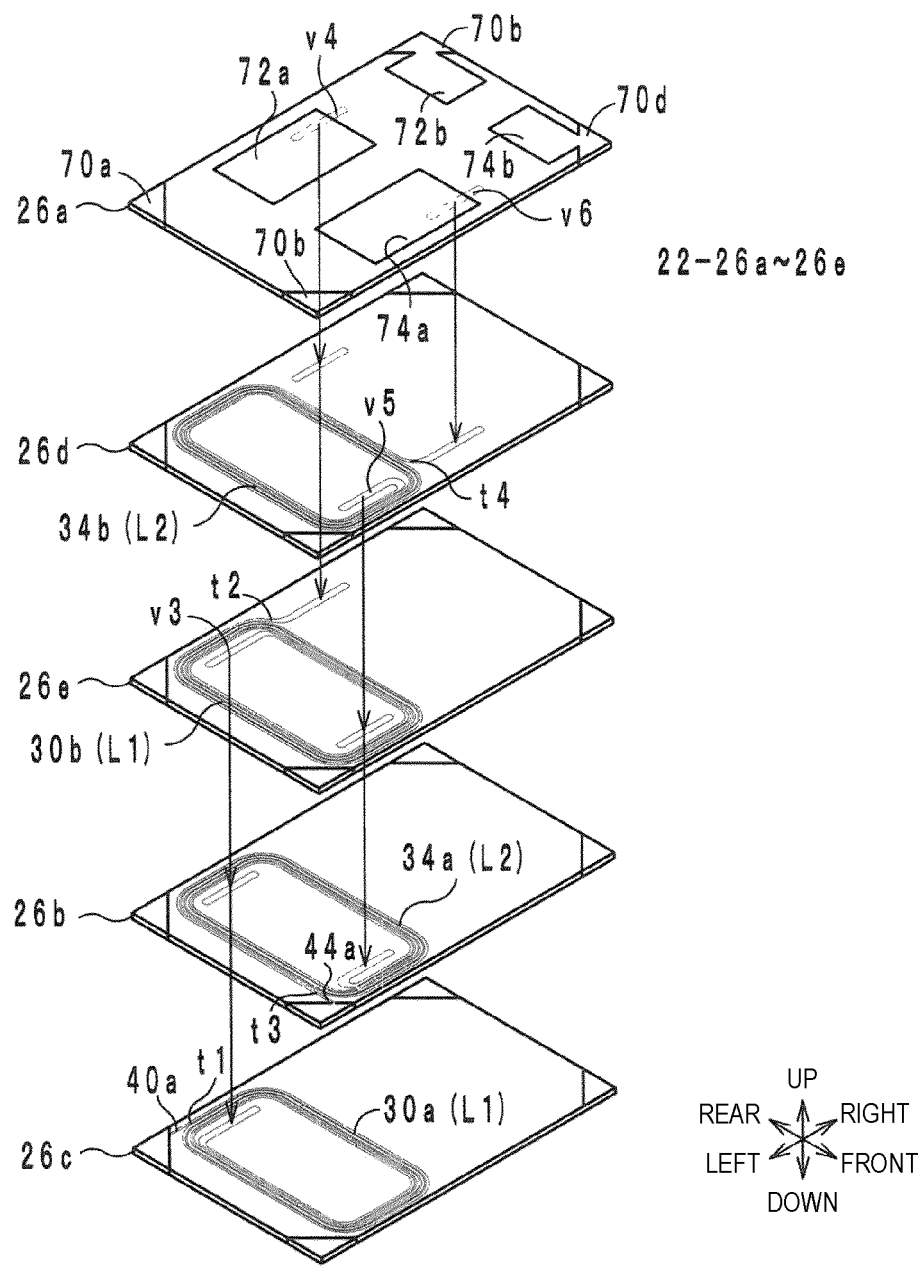
FIG. 4 is an exploded perspective view of a multilayer body of an electronic component.

Next, an electronic component 10a according to a first variation will be described with reference to drawings. FIG. 4 is an exploded perspective view of the multilayer body 22 of the electronic component 10a. The configuration of the electronic component 10a is the same as the electronic component 10 with the exception of the multilayer body 22. Therefore, FIGS. 1B and 2 are used for explanation for the configuration of the electronic component 10a. Furthermore, an equivalent circuit diagram of the electronic component 10a is the same as the electronic component 10. Therefore, FIG. 1A is used as the equivalent circuit diagram of the electronic component 10a.

The electronic component 10a is different from the electronic component 10 in the structure of the inductors L1 and L2. The electronic component 10a will be described below by focusing on the difference.

The multilayer body 22 of the electronic component 10a further includes insulating layers 26d and 26e. The insulating layers 26a, 26d, 26e, 26b, and 26c are laminated in this order from the top side to the bottom side.

The inductor L1 includes inductor conductive layers 30a and 30b (the inductor conductive layer 30a is an example of a third inductor conductive layer, and the inductor conductive layer 30b is an example of a fourth inductor conductive layer) and an interlayer connection conductor v3. The inductor conductive layer 30a has been described above, and therefore, a further explanation will not be given.

The inductor conductive layer 30b is provided on the upper surface of the insulating layer 26e, and has substantially a spiral shape extending from an inner peripheral side toward an outer peripheral side while circulating clockwise (an example of a predetermined circulation direction) when viewed from the top side. The inductor conductive layer 30b has a length of about four turns. Furthermore, the inductor conductive layer 30b is provided in a left half region of the insulating layer 26e when viewed from the top side, and has substantially a rectangular outer shape.

The interlayer connection conductor v3 is a conductor which penetrates through the insulating layers 26e and 26b in the up-down direction and which is provided on the upper surface of the insulating layer 26c, and has substantially a linear shape extending in the left-right direction when viewed from the top side. The interlayer connection conductor v3 is provided near a rear end of a region surrounded by the inductor conductive layers 30a, 30b, 34a, and 34b when viewed from the top side. The interlayer connection conductor v3 allows connection between the end portion on the inner peripheral side of the inductor conductive layer 30a and the end portion on the inner peripheral side of the inductor conductive layer 30b. Accordingly, the inductor conductive layer 30a and the inductor conductive layer 30b are electrically connected in series. The end portion t1 of the inductor L1 is an end portion on the outer peripheral side of the inductor conductive layer 30a. The end portion t2 of the inductor L1 is an end portion on the outer peripheral side of the inductor conductive layer 30b.

An interlayer connection conductor v4 is a conductor which penetrates through the insulating layers 26a and 26d in the up-down direction and which is provided on the upper surface of the insulating layer 26e, and has substantially a linear shape extending in the left-right direction when viewed from the top side. The interlayer connection conductor v4 is located outward relative to the outermost periphery of the inductor conductive layers 30a, 30b, 34a, and 34b when viewed from the top side. The interlayer connection conductor v4 allows connection between the electrode pad 72a and the end portion on the outer peripheral side of the inductor conductive layer 30b. Accordingly, the end portion t2 of the inductor L1 and the electrode pad 72a are electrically connected.

The inductor L2 further includes inductor conductive layers 34a and 34b and an interlayer connection conductor v5. The inductor conductive layer 34a has been described above, and therefore, a further explanation will not be given.

The inductor conductive layer 34b is provided on the upper surface of the insulating layer 26d, and has substantially a spiral shape extending from an inner peripheral side toward an outer peripheral side while circulating clockwise (an example of a predetermined circulation direction) when viewed from the top side. The inductor conductive layer 34b has a length of about four turns. Furthermore, the inductor conductive layer 34b is provided in a left half region of the insulating layer 26d when viewed from the top side, and has substantially a rectangular outer shape.

The interlayer connection conductor v5 is a conductor which penetrates through the insulating layers 26d and 26e in the up-down direction and which is provided on the upper surface of the insulating layer 26b, and has substantially a linear shape extending in the left-right direction when viewed from the top side. The interlayer connection conductor v5 is provided near a front end of the region surrounded by the inductor conductive layers 30a, 30b, 34a, and 34b when viewed from the top side. The interlayer connection conductor v5 allows connection between the end portion on the inner peripheral side of the inductor conductive layer 34a and the end portion on the inner peripheral side of the inductor conductive layer 34b. Accordingly, the inductor conductive layer 34a and the inductor conductive layer 34b are electrically connected in series. The end portion t3 of the inductor L2 is the end portion on the outer peripheral side of the inductor conductive layer 34a. The end portion t4 of the inductor L2 is the end portion on the outer peripheral side of the inductor conductive layer 34b.

An interlayer connection conductor v6 is a conductor which penetrates through the insulating layer 26a in the up-down direction and which is provided on the upper surface of the insulating layer 26d, and has substantially a linear shape extending in the left-right direction when viewed from the top side. The interlayer connection conductor v6 is located outward relative to the outermost periphery of the inductor conductive layers 30a, 30b, 34a, and 34b when viewed from the top side. The interlayer connection conductor v6 allows connection between the electrode pad 74a and the end portion on the outer peripheral side of the inductor conductive layer 34b. Accordingly, the end portion t4 of the inductor L2 and the electrode pad 74a are electrically connected. The other configuration of the electronic component 10a is the same as the electronic component 10, and therefore, explanation for the other configuration of the electronic component 10a will be omitted.

With the electronic component 10a configured as described above, for the same reason as the electronic component 10, the mounting area may be reduced. Furthermore, for the same reason as the electronic component 10, the insulating layer 26a is made of a magnetic material in the electronic component 10a. Therefore, the Q value of the inductors L1 and L2 may be improved.

(Second Variation)

Figure 5:
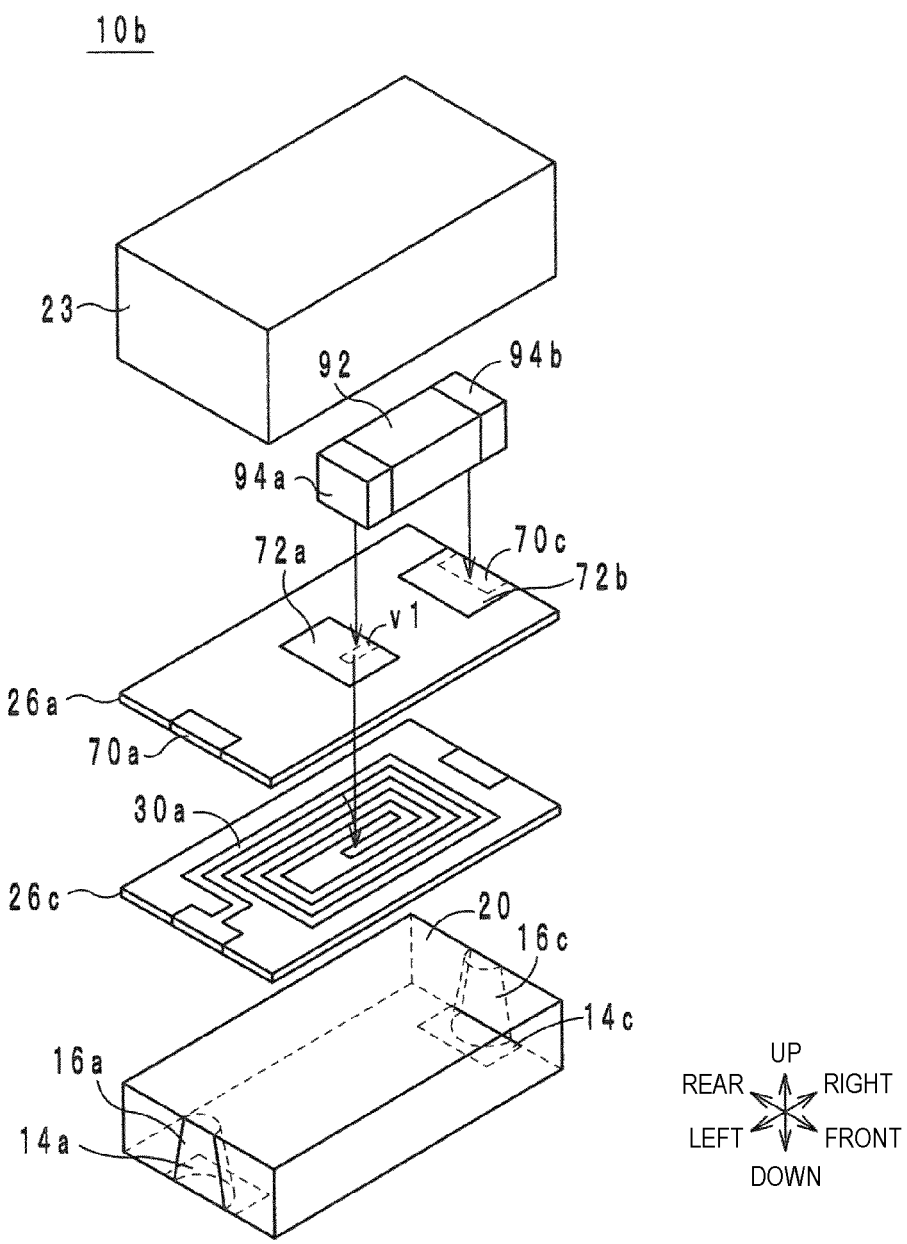
FIG. 5 is an exploded perspective view of an electronic component.

Next, an electronic component 10b according to a second variation will be described with reference to drawings. FIG. 5 is an exploded perspective view of the electronic component 10b.

The electronic component 10b is different from the electronic component 10 in that the electronic component 10b includes the inductor L1 and the capacitor C1 but includes neither the inductor L2 nor the capacitor C2. That is, the electronic component 10b has a rear half configuration of the electronic component 10, and does not have a front half configuration of the electronic component 10. Parts common in the configuration of the electronic component 10b and the configuration of the electronic component 10 will be referred to with the same reference signs.

As described above, the electronic component 10b configures an LC series resonator, without configuring a common mode filter. Even with the electronic component 10b having the above configuration, for the same reason as the electronic component 10, the mounting area may be reduced. Furthermore, with the electronic component 10b, for the same reason as the electronic component 10, a lead conductive layer for allowing connection between the upper end of the interlayer connection conductor v1 and the upper end of the connection conductor 70c is not required. Consequently, in the electronic component 10b, occurrence of disconnection is suppressed. Furthermore, in the electronic component 10b, for the same reason as the electronic component 10, the insulating layer 26a is made of a magnetic material, and therefore, the Q value of the inductors L1 and L2 may be improved.

[Other Embodiments]

An electronic component according to the present disclosure may be changed within the scope of the present disclosure, without being limited to the electronic component 10, 10a, or 10b.

The configurations of the electronic components 10, 10a, and 10b may be combined in a desired manner.

In the electronic components 10, 10a, and 10b, the outer electrodes 14a to 14d are provided on the lower surface of the magnetic substrate 20. However, a position at which the outer electrodes 14a to 14d are provided is not limited to this position. The outer electrodes 14a to 14d may be provided on a surface different from the upper surface of the magnetic substrate 20 (that is, a right surface, a left surface, a front surface, or a rear surface).

In the electronic component 10, the inductor conductive layers 30b and 34b may be provided in a portion above the inductor conductive layers 30a and 34a, and the inductor conductive layers 30c and 34c may be provided in a portion above the inductor conductive layers 30b and 34b. The inductor conductive layers 30b and 34b have the same structure as the inductor conductive layers 30b and 34b of the electronic component 10a. Furthermore, the inductor conductive layers 30c and 34c have substantially a spiral shape extending from an outer peripheral side toward an inner peripheral side while circulating clockwise. End portions on the outer peripheral side of the inductor conductive layers 30c and 34c are connected to end portions on the outer peripheral side of the inductor conductive layers 30b and 34b with an interlayer connection conductor interposed therebetween. Furthermore, end portions on the inner peripheral side of the inductor conductive layers 30c and 34c are connected to the electrode pads 72a and 74a with an interlayer connection conductor interposed therebetween. In the electronic component 10, a larger number of inductor conductive layers may be connected in series. Also in the electronic components 10a and 10b, a larger number of inductor conductive layers may be connected in series.

Substantially the spiral shape represents a two-dimensional helical shape.

In place of the capacitors C1 and C2, chip components such as resistors may be mounted.

Furthermore, in the electronic components 10, 10a, and 10b, a surface mounted electronic component may be mounted on the electrode pads 72a, 72b, 74a, and 74b. The surface mounted electronic component represents an electronic component mounted on a surface of a substrate by soldering or the like, and may be a chip component. For example, a surface mounted electronic component such as a winding coil may be used as a surface mounted electronic component different from a chip component.

As described above, the present disclosure is useful for an electronic component, and more particularly, is excellent in reducing a mounting area.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
a substrate including a first main surface and a second main surface;
a first inductor which is provided on a first direction side relative to the first main surface when a direction separating from the substrate in a normal direction of the first main surface is defined as the first direction, which includes one or more first inductor conductive layers having substantially a spiral shape when viewed from the first direction side relative to the first main surface, and which includes a first end portion and a second end portion;
a first outer electrode and a second outer electrode which are provided on a surface different from the first main surface of the substrate; and
a first surface mounted electronic component which is provided on the first direction side relative to the first inductor, which overlaps the first inductor when viewed from the first direction side relative to the first main surface, and which includes a third outer electrode and a fourth outer electrode,
wherein the first end portion and the first outer electrode are electrically connected,
wherein the second end portion and the third outer electrode are electrically connected, and
wherein the second outer electrode and the fourth outer electrode are electrically connected.

2. The electronic component according to claim 1,
wherein the first inductor circulates in a predetermined circulation direction from the first end portion toward the second end portion,
wherein the one or more first inductor conductive layers include a second inductor conductive layer extending from an outer peripheral side toward an inner peripheral side while circulating in the predetermined circulation direction when viewed from the first direction side relative to the first main surface,
wherein the second end portion is an end portion on an inner peripheral side of the second inductor conductive layer, and
wherein the second outer electrode and the fourth outer electrode are electrically connected in a portion which is outward relative to an outermost periphery of the one or more first inductor conductive layers when viewed from the first direction side relative to the first main surface.

3. The electronic component according to claim 2,
wherein the first end portion of the first inductor is an end portion on an outer peripheral side of the second inductor conductive layer.

4. The electronic component according to claim 1,
wherein the first inductor circulates in a predetermined circulation direction from the first end portion toward the second end portion,
wherein the one or more first inductor conductive layers include a third inductor conductive layer extending from an outer peripheral side toward an inner peripheral side while circulating in the predetermined circulation direction and a fourth inductor conductive layer extending from an inner peripheral side toward an outer peripheral side while circulating in the predetermined circulation direction when viewed from the first direction side relative to the first main surface, wherein the first end portion is an end portion on an outer peripheral side of the third inductor conductive layer, wherein the second end portion is an end portion on an outer peripheral side of the fourth inductor conductive layer, and wherein the second outer electrode and the fourth outer electrode are electrically connected in a portion which is outward relative to an outermost periphery of the fourth inductor conductive layer when viewed from the first direction side relative to the first main surface.

5. The electronic component according to claim 1, wherein a plurality of insulating layers are laminated in the first direction on the first main surface, and wherein the one or more first inductor conductive layers are provided on the insulating layers.

6. The electronic component according to claim 5, further comprising:

a first electrode pad which is provided on an insulating layer which is one of the insulating layers and which is electrically connected to the second end portion; and a second electrode pad which is provided on the insulating layer and which is electrically connected to the second outer electrode, wherein the third outer electrode and the fourth outer electrode are mounted on the first electrode pad and the second electrode pad, respectively.

7. The electronic component according to claim 1, wherein the first outer electrode and the second outer electrode are provided on the second main surface, and wherein the electronic component further includes:

a first connection part which allows electric connection between the first end portion and the first outer electrode and which extends across the substrate in the first direction; and a second connection part which allows electric connection between the second outer electrode and the fourth outer electrode and which extends across the substrate in the first direction.

8. The electronic component according to claim 1, further comprising:

a second inductor which is provided on the first direction side relative to the first main surface, which includes one or more fifth inductor conductive layers having substantially a spiral shape when viewed from the first direction side relative to the first main surface, and which includes a third end portion and a fourth end portion;

a fifth outer electrode and a sixth outer electrode provided on a surface different from the first main surface of the substrate; and a second surface mounted electronic component which is provided on the first direction side relative to the second inductor, which overlaps the second inductor when viewed from the first direction side relative to the first main surface, and which includes a seventh outer electrode and an eighth outer electrode, wherein the first inductor and the second inductor form a common mode choke coil, wherein the third end portion and the fifth outer electrode are electrically connected, wherein the fourth end portion and the seventh outer electrode are electrically connected, and wherein the sixth outer electrode and the eighth outer electrode are electrically connected.

9. The electronic component according to claim 1, wherein the substrate is made of a magnetic material.

* * * * *